United States Patent
Li et al.

(10) Patent No.: US 9,520,347 B2
(45) Date of Patent: Dec. 13, 2016

(54) LEAD FRAME CONSTRUCT FOR LEAD-FREE SOLDER CONNECTIONS

(71) Applicant: Honeywell International Inc., Morris Plains, NJ (US)

(72) Inventors: Jianxing Li, Spokane Valley, WA (US); Kevin B. Albaugh, Liberty Lake, WA (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 14/888,321

(22) PCT Filed: Apr. 22, 2014

(86) PCT No.: PCT/US2014/034896
§ 371 (c)(1),
(2) Date: Oct. 30, 2015

(87) PCT Pub. No.: WO2014/179108
PCT Pub. Date: Nov. 6, 2014

(65) Prior Publication Data
US 2016/0064311 A1 Mar. 3, 2016

Related U.S. Application Data

(60) Provisional application No. 61/819,281, filed on May 3, 2013.

(51) Int. Cl.
*H01L 23/495* (2006.01)
*H01L 21/48* (2006.01)
*H01L 23/00* (2006.01)

(52) U.S. Cl.
CPC ..... *H01L 23/49575* (2013.01); *H01L 21/4821* (2013.01); *H01L 23/495* (2013.01);
(Continued)

(58) Field of Classification Search
CPC ............... H01L 24/83; H01L 23/53252; H01L 21/4821; H01L 24/33; H01L 24/30; H01L 23/495; H01L 23/49575
See application file for complete search history.

(56) References Cited

U.S. PATENT DOCUMENTS 3,922,712 A 11/1975 Stryker
4,048,705 A 9/1977 Blanpain et al.
(Continued)

FOREIGN PATENT DOCUMENTS

CA 2778474 A1 5/2003
CN 101092006 A 12/2007
(Continued)

OTHER PUBLICATIONS

Chen, Kang-I et al., The Microstructures and Mechanical Properties of the Sn—Zn—Ag—Al—Ga Solder Alloys—The Effect of Ga, Journal of Electronic Materials, vol. 32, No. 10 2003, pp. 1111-1116.
(Continued)

*Primary Examiner* — Alonzo Chambliss
(74) *Attorney, Agent, or Firm* — Faegre Baker Daniels LLP

(57) ABSTRACT

An electronics packaging arrangement, a lead frame construct for use in an electronics packaging arrangement, and a method for manufacturing an electronics packaging arrangement. A lead frame made of copper, for example, includes a metallic barrier layer of nickel, for example, to prevent oxidation of the metal of the lead frame. A relatively thin wetting promoting layer of copper, for example, is provided on the metallic barrier layer to promote uniform wetting of a solder, such as a lead-free, zinc-based solder, onto the lead frame during a die connect process by which a chip is connected to the lead frame. A copper/zinc intermetallic layer is formed during the flow and solidification of (Continued)

the solder. Substantially all of the copper in the copper layer is consumed during formation of the copper/zinc intermetallic layer, and the intermetallic layer is sufficiently thin to resist internal cracking failure during manufacture and subsequent use of the electronics packaging arrangement.

14 Claims, 6 Drawing Sheets

(52) U.S. Cl.
CPC .. *H01L 23/49513* (2013.01); *H01L 23/49541* (2013.01); *H01L 23/49582* (2013.01); *H01L 24/30* (2013.01); *H01L 24/32* (2013.01); *H01L 24/33* (2013.01); *H01L 24/83* (2013.01); H01L 24/29 (2013.01); H01L 2224/291 (2013.01); H01L 2224/29111 (2013.01); H01L 2224/29116 (2013.01); H01L 2224/29118 (2013.01); H01L 2224/32245 (2013.01); H01L 2224/32503 (2013.01); H01L 2224/8381 (2013.01); H01L 2224/83409 (2013.01); H01L 2224/83411 (2013.01); H01L 2224/83413 (2013.01); H01L 2224/83418 (2013.01); H01L 2224/83439 (2013.01); H01L 2224/83444 (2013.01); H01L 2224/83447 (2013.01); H01L 2224/83464 (2013.01); H01L 2224/83469 (2013.01); H01L 2224/83476 (2013.01); H01L 2224/83815 (2013.01); H01L 2924/0103 (2013.01); H01L 2924/0105 (2013.01); H01L 2924/01028 (2013.01); H01L 2924/01046 (2013.01); H01L 2924/01047 (2013.01); H01L 2924/01049 (2013.01); H01L 2924/01078 (2013.01); H01L 2924/01079 (2013.01); H01L 2924/01083 (2013.01); H01L 2924/15747 (2013.01); H01L 2924/17747 (2013.01); H01L 2924/2064 (2013.01); H01L 2924/3512 (2013.01)

(56) References Cited

U.S. PATENT DOCUMENTS

| | | |
|---|---|---|
| 4,559,078 A | 12/1985 | Maier et al. |
| 4,929,423 A | 5/1990 | Tucker et al. |
| 5,019,336 A | 5/1991 | Liebermann et al. |
| 5,109,510 A | 4/1992 | Baker et al. |
| 5,242,658 A | 9/1993 | Stevens et al. |
| 5,411,703 A | 5/1995 | Gonya et al. |
| 5,436,082 A | 7/1995 | Mathew |
| 5,527,628 A | 6/1996 | Anderson et al. |
| 5,536,908 A | 7/1996 | Etchells et al. |
| 5,698,160 A | 12/1997 | Chen et al. |
| 5,851,482 A | 12/1998 | Kim |
| 5,980,822 A | 11/1999 | Moon et al. |
| 6,027,575 A | 2/2000 | Paruchuri et al. |
| 6,037,653 A | 3/2000 | Kim et al. |
| 6,156,132 A | 12/2000 | Yamashita et al. |
| 6,176,947 B1 | 1/2001 | Hwang et al. |
| 6,179,935 B1 | 1/2001 | Yamashita et al. |
| 6,180,264 B1 | 1/2001 | Takaoka et al. |
| 6,184,475 B1 | 2/2001 | Kitajima et al. |
| 6,228,322 B1 | 5/2001 | Takeda et al. |
| 6,241,942 B1 | 6/2001 | Murata et al. |
| 6,319,461 B1 | 11/2001 | Domi et al. |
| 6,361,626 B1 | 3/2002 | Kitajima et al. |
| 6,563,225 B2 | 5/2003 | Soga et al. |
| 6,726,907 B1 | 4/2004 | Zhang et al. |
| 6,840,434 B2 | 1/2005 | Clay et al. |
| 6,893,512 B2 | 5/2005 | Kitajima et al. |
| 6,926,849 B2 | 8/2005 | Taguchi et al. |
| 7,187,083 B2 | 3/2007 | Lewis et al. |
| 7,256,501 B2 | 8/2007 | Okamoto et al. |
| 7,282,174 B2 | 10/2007 | Hirata et al. |
| 7,282,175 B2 | 10/2007 | Amagai et al. |
| 7,681,777 B2 | 3/2010 | Hirata et al. |
| 7,682,468 B2 | 3/2010 | Munekata et al. |
| 7,749,340 B2 | 7/2010 | Huang et al. |
| 7,750,475 B2 | 7/2010 | Souma et al. |
| 7,800,230 B2 | 9/2010 | Hirano et al. |
| 7,854,996 B2 | 12/2010 | Sato et al. |
| 8,581,106 B2 * | 11/2013 | Oshika .............. H01L 23/49811 174/256 |
| 8,669,652 B2 * | 3/2014 | Hata ................. H01L 23/49524 257/690 |
| 2001/0000321 A1 | 4/2001 | Takeda et al. |
| 2002/0149114 A1 * | 10/2002 | Soga ..................... B22F 1/0003 257/772 |
| 2003/0189086 A1 | 10/2003 | Clay et al. |
| 2006/0061974 A1 | 3/2006 | Soga et al. |
| 2006/0067853 A1 | 3/2006 | Takahashi et al. |
| 2006/0125105 A1 | 6/2006 | Kitajima et al. |
| 2006/0145352 A1 | 7/2006 | Soga et al. |
| 2006/0192294 A1 | 8/2006 | Lee |
| 2006/0231931 A1 | 10/2006 | Kang et al. |
| 2007/0105341 A1 | 5/2007 | Sosnowchik et al. |
| 2008/0292493 A1 | 11/2008 | Lee et al. |
| 2009/0053555 A1 | 2/2009 | Nose et al. |
| 2009/0139608 A1 | 6/2009 | Tanaka et al. |
| 2009/0141498 A1 | 6/2009 | Kawanobe et al. |
| 2009/0270963 A1 | 10/2009 | Pelger et al. |
| 2010/0012708 A1 | 1/2010 | Steward et al. |
| 2010/0116376 A1 | 5/2010 | Huang et al. |
| 2010/0193801 A1 | 8/2010 | Yamada et al. |
| 2010/0294565 A1 | 11/2010 | Kawamata et al. |
| 2011/0132451 A1 | 6/2011 | von Campe et al. |
| 2011/0204121 A1 | 8/2011 | Kawamata et al. |
| 2011/0244629 A1 | 10/2011 | Gong et al. |
| 2012/0055586 A1 | 3/2012 | McIsaac et al. |
| 2012/0313131 A1 | 12/2012 | Oda et al. |
| 2012/0313230 A1 | 12/2012 | Mengel et al. |
| 2013/0045131 A1 | 2/2013 | Li et al. |
| 2015/0294920 A1 * | 10/2015 | Asai ....................... H01L 23/48 257/666 |

FOREIGN PATENT DOCUMENTS

| | | |
|---|---|---|
| CN | 102285792 B | 12/2011 |
| DE | 19816671 C2 | 10/1998 |
| DE | 19904765 B4 | 8/1999 |
| EP | 0704272 B1 | 4/1996 |
| EP | 0855242 B1 | 7/1998 |
| EP | 0976489 A1 | 2/2000 |
| EP | 0988920 A1 | 3/2000 |
| EP | 1112803 B1 | 7/2001 |
| EP | 1531024 B1 | 5/2005 |
| EP | 1890304 A1 | 2/2008 |
| EP | 2070637 E1 | 6/2009 |
| JP | 56013456 A | 2/1981 |
| JP | S62141747 A | 6/1987 |
| JP | 11172352 A | 6/1999 |
| JP | 2000061686 A | 2/2000 |
| JP | 2000094181 A | 4/2000 |
| JP | 2002307188 A | 10/2002 |
| JP | 2004238720 A | 6/2004 |
| JP | 2004292944 A | 10/2004 |
| JP | 2004358539 A | 12/2004 |
| JP | 2006088204 A | 4/2006 |
| JP | 2006088205 A | 4/2006 |
| JP | 2006289493 A | 10/2006 |
| JP | 2006320913 A | 11/2006 |
| JP | 2009142849 A | 7/2009 |
| JP | 2009203545 A | 9/2009 |
| JP | 2009538176 A | 11/2009 |
| JP | 2010069502 A | 4/2010 |
| JP | 2011056555 A | 3/2011 |
| JP | 2011224598 A | 11/2011 |
| JP | 2011235342 A | 11/2011 |
| JP | 2011238838 A | 11/2011 |
| JP | 2011528493 A | 11/2011 |

(56) References Cited

FOREIGN PATENT DOCUMENTS

| JP | 2012183558 A | 9/2012 |
|---|---|---|
| JP | 2012228729 A | 11/2012 |
| JP | 2011251330 A | 11/2015 |
| KR | 20040035863 A | 4/2004 |
| SU | 1731547A1 A | 5/1992 |
| WO | 9520460 A1 | 8/1995 |
| WO | 9634412 A1 | 10/1996 |
| WO | 0209936 A1 | 2/2002 |
| WO | 2007050571 A2 | 5/2007 |
| WO | 2009051240 A1 | 4/2009 |
| WO | 2012029470 A1 | 3/2012 |
| WO | 2014179108 A1 | 11/2014 |
| WO | 2015084723 A1 | 6/2015 |

OTHER PUBLICATIONS

Csanady, A. et al., "The Influence of Some Alloying Additions (Cr, Cu, and Li) on the Thermal Oxidation of Al—Zn—Mg Alloys", Corrosion Science, vol. 22, No. 7, pp. 689-713, 1982.

Hee-Young, Cho et al., "A New Ni—Zn Under Bump Metallurgy for Pb-free Solder Bump Flip Chip Application", 2010 IEEE, Electronic Components and Technology Conference, pp. 151-155.

Hague, A. et al., "Die Attach Properties of Zn—Al—Mg—Ga Based High-Temperature Lead-Free solder on Cu Lead-Frame", Journal of Materials Science: Materials in Electronics, vol. 23, No. 1, published online Sep. 7, 2011, pp. 115-123.

International Search Report and Written Opinion issued in PCT/US2012/051343, mailed Feb. 18, 2013, 7 pages.

International Search Report and Written Opinion issued in PCT/US2014/034896, mailed Sep. 1, 2014, 3 pages.

International Search Report and Written Opinion issued in PCT/US2014/067913, mailed Mar. 13, 2015, 11 pages.

International Search Report and Written Opinion] issued in PCT/US2001/02778, mailed Nov. 6, 2001, 2 pages.

Kwang-Lung, Lin et al., "Improvements in the Properties of Sn—Zn Eutectic Based Pb-Free Solder", 2003 IEEE, Electronic Components and Technology Conference, pp. 658-663.

Kwang-Lung, Lin et al., "The Bonding of Sn—Zn—Ag—Al—Ga Free Solder Balls on Cu/Ni—P/Au BGA Substrate", 2005 IEEE, Electronic Components and Technology Conference, pp. 692-695.

Kwang-Lung, Lin et al., "The Electromigration Investigation of the Newly Developed Pb-Free Sn—Zn—Ag—Al—Ga Free Solder Balls Interconnect", 2007 IEEE, Electronic Components and Technology Conference, pp. 1467-1471.

Kwang-Lung, Lin et al., "The Wetting Interaction Between Pb-Free Sn—Zn Series Solders and Cu, Ag Substrates", 2004 IEEE, Electronic Components and Technology Conference, pp. 1310-1313.

Li, Jianxing et al., "High Melting Temperature Lead Free Solder for Die Attach Application", IMAPS 2011, 44th International Symposium of Microelectronics, Long Beach Convention Center, Long Beach, California USA, Oct. 9-13, 2011, www.imaps2011.org.

Li, Jianxing et al., "High Melting Temperture Lead Free Solder for Die Attach Application", IMAPS 2011, 44th International Symposium of Microelectronics, Long Beach, California, Oct. 9-13, 2011.

Rettenmayr, M. et al., "Zn—Al Based Alloys as Pb-Free Solders for Die Attach",Journal of Electronic Materials, vol. 28, No. 11, 1999, pp. 1172-1175.

Shimizu, T. et al., "Zn—Al—Mg—Ga Alloys as Pb-Free Solder for Die Attaching Use", Journal of Electronic Materials, vol. 28, No. 11, 1999, pp. 1172-1175.

Supplementary European Search Report issed in EP Application No. 01984406, dated Sep. 5, 2005, 3pages.

Zeng, G., et. al. Development of High-Temperature Solders: Review. Microelectronics Reliability, 52:1306-1322, 2012.

Written Opinion issued in SG Application No. 11201507462Q, issued on Jul. 28, 2016, 5 pages.

Hague, A., et al. Effect of Ni Metallization on Interfacial Reactions and Die Attach Properties of Zn-Al-Mg-Ga High Temperature Lead-free Solder. 34th International Electronic Manufacturing Technology Conference, 2010, 6 pages.

Li, Wu-Hu, et al. Comparative Study of NiNiP Leadframes from Different Processes. 2010 12th Electronica Packaging Technology Conference, pp. 255-259.

Supplementary European Search Report issued in EP Application No. 14791586.2, mailed Sep. 12, 2016, 11 pages.

* cited by examiner

LEAD FRAME CONSTRUCT FOR LEAD-FREE SOLDER CONNECTIONS

CROSS-REFERENCE TO RELATED APPLICATION

This application is a national phase application of PCT Application No. PCT/US2014/034896, internationally filed Apr. 22, 2014, which claims the benefit under Title 35, U.S.C. §119 of U.S. Provisional Application No. 61/819,281, filed May 3, 2013, and the entire specifications of each are incorporated by reference in their entirety.

BACKGROUND

1. Technical Field

The present disclosure relates to electronics packaging arrangements and, in particular, relates to soldered connections formed between chips and lead frames using lead-free solders, as well lead frame constructs and methods of manufacturing electronics packaging arrangements.

2. Description of the Related Art

Solder materials are used in the manufacture and assembly of a variety of electromechanical and electronic devices. In the past, solder materials have commonly included substantial amounts of lead to provide the solder materials with desired properties such as melting point, wetting properties, ductility and thermal conductivities. Some tin-based solders have also been developed. More recently, there have been attempts at producing lead-free and tin-free solder materials that provide desired performance characteristics.

In the electronics manufacturing industry, solder materials are used for making soldered connections between a chip and a lead frame. One family of lead-free solders are zinc-based solders, which are alloys including zinc as a major component, together with other alloying elements such as aluminum and/or additional elements as discussed, for example, in U.S. patent application Ser. No. 13/586,074 (U.S. Patent Application Publication No. 2013/0045131), entitled "Lead-Free Solder Compositions", assigned to the assignee of the present invention, the entire disclosure of which is expressly incorporated herein by reference.

SUMMARY

The present disclosure provides an electronics packaging arrangement, a lead frame construct for use in an electronics packaging arrangement, and a method for manufacturing an electronics packaging arrangement.

A lead frame made of copper, for example, includes a metallic barrier layer of nickel, for example, to prevent oxidation of the metal of the lead frame. A relatively thin wetting promoting layer of copper, for example, is provided on the metallic barrier layer to promote uniform wetting of a solder, such as a lead-free, zinc-based solder, onto the lead frame during a die connect process by which a chip is connected to the lead frame. A copper/zinc intermetallic layer is formed during the flow and solidification of the solder. Substantially all of the copper in the copper layer is consumed during formation of the copper/zinc intermetallic layer, and the intermetallic layer is sufficiently thin to resist internal cracking failure during manufacture and subsequent use of the electronics packaging arrangement.

In one form thereof, the present disclosure provides an electronics packaging arrangement, including a lead frame having a surface; a metallic barrier layer disposed on the surface of the lead frame; a chip connected to the metallic barrier layer via a zinc-based solder layer; and an intermetallic layer disposed between the metallic barrier layer and the zinc-based solder layer, the intermetallic layer comprising an intermetallic compound including zinc.

In another form thereof, the present disclosure provides a method of manufacturing an electronics packaging arrangement, said method including the step of: providing a lead frame including a metallic barrier layer disposed on a surface of the lead frame, and a wetting promoting layer disposed on the metallic barrier layer; connecting a chip to the lead frame by the following steps: flowing a zinc-based solder over the wetting promoting layer; placing a chip on the zinc-based solder; and solidifying the zinc-based solder with formation of an intermetallic layer between the zinc-based solder and the metallic barrier layer, the intermetallic layer comprising an intermetallic compound including zinc.

In a further form thereof, the present disclosure provides a lead frame construct, including a lead frame having a surface; a metallic barrier layer disposed on the surface of the lead frame; and a wetting promoting layer disposed on the metallic barrier layer.

In a still further form thereof, the present disclosure provides a method of manufacturing a lead frame construct, the method including the steps of: providing a lead frame having a surface; forming a metallic barrier layer on the surface of the lead frame; and subsequently, forming a wetting promoting layer on the metallic barrier layer.

BRIEF DESCRIPTION OF THE DRAWINGS

The above-mentioned and other features of the disclosure, and the manner of attaining them, will become more apparent and will be better understood by reference to the following description of embodiments of the disclosure taken in conjunction with the accompanying drawings, wherein:

FIGS. 3 and 4 correspond to Example 1, wherein:

FIG. 3 is a cross sectional optical microscopy image of a lead frame construct having a copper layer with a thickness of 2 µm; and FIG. 4 is a cross sectional optical microscopy image of a lead frame construct having a copper layer with a thickness of 8 µm.

FIGS. 5-7 correspond to Example 2, wherein:

FIG. 5 is an image of a zinc-based solder wetted onto the lead frame of FIG. 3;

FIG. 6 is an image of a zinc-based solder wetted onto the lead frame of FIG. 4; and FIG. 7 is an image of a zinc-based solder wetted onto a control lead frame which includes a nickel barrier layer but which lacks a copper layer.

FIGS. 8-11 correspond to Example 3, wherein:

FIG. 8 is a scanning electron microscope (SEM) cross sectional image of the zinc-based solder solidified onto the lead frame of FIG. 5;

FIG. 10 is a scanning electron microscope (SEM) cross sectional image of the zinc-based solder solidified onto the lead frame of FIG. 6.

Corresponding reference characters indicate corresponding parts throughout the several views. The exemplifications set out herein illustrate embodiments of the disclosure and such exemplifications are not to be construed as limiting the scope of the invention in any manner.

DETAILED DESCRIPTION

Figure 1A:
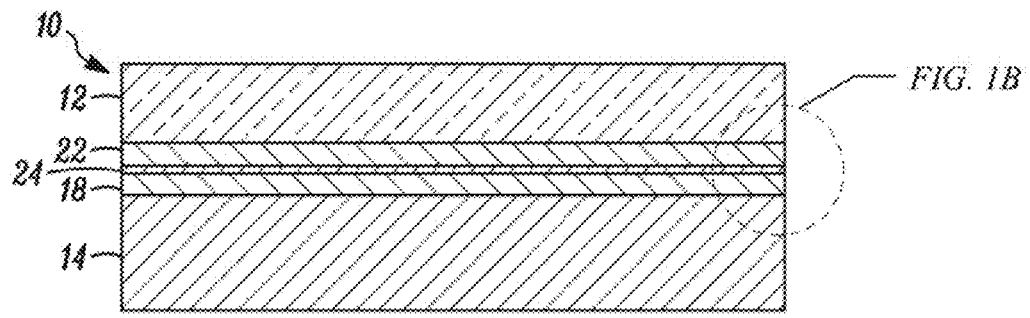
FIG. 1A is a schematic cross sectional view of an exemplary electronics packaging arrangement including a chip connected to a lead frame.
Figure 1B:
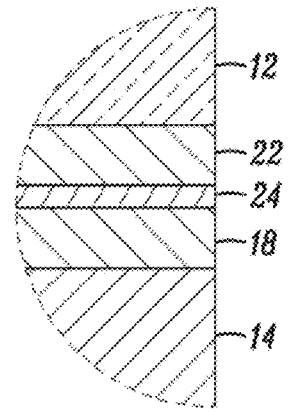
FIG. 1B is a fragmentary view of a portion of FIG. 1A.

Referring to FIGS. 1A and 1B, a schematic cross sectional view of an exemplary electronics packaging arrangement 10 according to the present disclosure is shown, including a chip 12 (i.e., an integrated circuit and/or microprocessor) connected to a lead frame 14 via a multi-layer soldered connection of the type described below and, in particular, a soldered connection including a lead free, zinc-based solder.

Figure 2A:
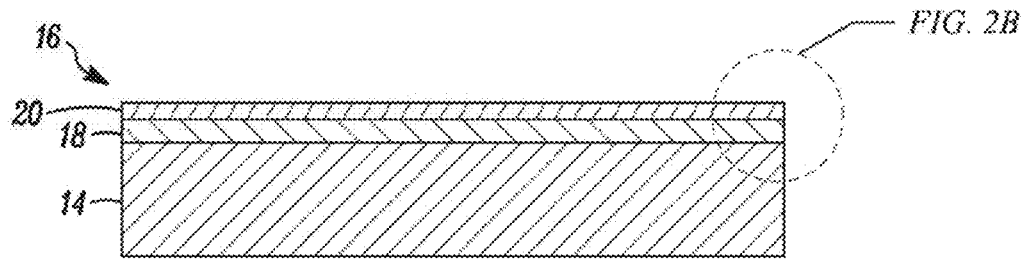
FIG. 2A is a schematic cross sectional view of an exemplary lead frame construct used in the electronics packaging arrangement of FIGS. 1A and 1B.
Figure 2B:
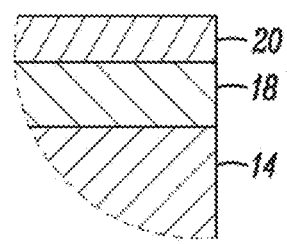
FIG. 2B is a fragmentary view of a portion of FIG. 2A.

A lead frame construct 16 according to the present disclosure is shown in FIGS. 2A and 2B prior to use in a die connect process by which a chip is connected to the lead frame construct 16 via a soldered connection to form the electronics packaging arrangement 10 shown in FIG. 1A. Lead frame construct 16 includes lead frame 14 in the form of a metallic, electrically-conductive substrate to which one or more chips may be attached, and lead frame 14 and/or an attached chip may also include electrical leads or other components (not shown) connected thereto. Lead frame 14 is typically made of pure copper or a copper alloy.

When lead frame 14 is made of pure copper or a copper alloy, however, the surface of the copper of lead frame 14 will tend to spontaneously oxidize to copper oxide upon contact with oxygen in the atmosphere, thereby forming a copper oxide layer. Copper oxide is electrically insulating, which can degrade the electrical conductivity of lead frame 14, and any copper oxide layer that is formed may also impede the ability for liquid solder to wet the surface of lead frame 14 during a die connect process and/or may compromise the integrity of the resulting connection between lead frame 14 and chip 12.

Lead frame 14 is provided with a metallic barrier layer 18 on at least one surface of lead frame 14, and optionally, on each of the opposite surfaces of lead frame 14, depending on the application, in order to prevent oxidation of the metal of the underlying lead frame 14. Barrier layer 18 may be made of a metal that has a reduced tendency for oxidation as compared with the metal of lead frame 14. In one embodiment, barrier layer 18 is made of pure nickel or a nickel alloy. Thus, barrier layer 18 covers the surface of lead frame 14 and prevents the metal of lead frame 14 from contacting the surrounding environment and spontaneously oxidizing with oxygen. Further, as discussed below, barrier layer 18 also functions to prevent the metal of lead frame 14 from contacting the solder which is used to secure chip 12 to lead frame 14 during the die connect process, which leads to the formation of intermetallic compounds between the metal of lead frame 14 and the metal(s) of the solder.

Barrier layer 18 may be formed on lead frame 14 by a plating process, such as via electroplating or electro-less plating. In addition, barrier layer 18 may be formed in a continuous or blanket manner over the entire surface of lead frame 14 or alternatively, may be selectively formed over the die pad areas and/or other selected regions of the surface of lead frame 14.

In an electroplating process, lead frame 14 is the cathode in an electroplating bath of a solution of the dissolved metal to be deposited. The metal to be deposited is typically the anode. Upon application of electric current, dissolved metal ions in the bath are reduced and deposit onto the lead frame cathode to form barrier layer 18.

In one embodiment, a sulfamate electrolyte bath may contain dissolved nickel, and the electroplating bath may also lack organic additives that are typically present in the form of brightening agents, for example. Use of the foregoing bath results in a deposited metal surface having a somewhat rough or "matte" finish.

Alternatively, an electro-less deposition process may be used which is not conducted in the presence of an applied electric current, but rather is an auto-catalytic reaction that employs a reducing agent, such as hydrated sodium hypophosphite ($NaPO_2H_2.H_2O$), to reduce ions of the deposited metal from solution and deposit the metal onto the surface of lead frame 14. A barrier layer of nickel plated onto a lead frame according to such a process may be referred to as an "electroless nickel" layer, and typically will be a nickel alloy including nickel which is alloyed with about 2-4 wt. % of phosphorus, for example.

Typically, the thickness of the barrier layer 18 is up to 10 microns ($\mu m$), such as between 1 $\mu m$ and 10 $\mu m$. In one embodiment, the thickness of barrier layer 18 may be as little as 1, 2, or 3 $\mu m$ and as great as 5, 6, 7, 8, 9, or 10 $\mu m$, for example, or may have a thickness within any range defined between any pair of the foregoing values.

Referring to FIGS. 2A and 2B, lead frame construct 16 includes a wetting promoting layer 20, which may alternatively be referred to as a wetting promoting "flash", and which may be relatively thin in comparison with barrier layer 18 for the reasons discussed below. Wetting promoting layer 20 is formed on barrier layer 18 to aid in wetting of the liquid solder in a uniform manner over the lead frame 14 when the liquid solder is flowed onto the lead frame 14 during a die connect process.

Wetting promoting layer 20 may be a copper or copper alloy layer, though may alternatively be layer of zinc, bismuth, tin, indium or a precious metal such as gold, silver, palladium, platinum, as well as alloys of the foregoing. In particular, it has been found that certain solder compositions and, in particular, zinc-based solder compositions of the type disclosed herein, wet very uniformly and effectively over a copper or copper alloy surface. If desired, lead frame construct 16 may be packaged in an inert environment prior to use in a die connect process to prevent oxidation of wetting promoting layer 20. If oxidation resistance is desired in addition to the promotion of solder wetting, layer 20 may alternatively be a layer of gold, platinum, palladium, ruthenium, or silver.

Layer 20 may have a thickness up to 10 microns ($\mu m$), such as between 1 $\mu m$ and 10 $\mu m$. In one embodiment, the thickness of copper layer 16 may be as little as 1, 2, or 3 $\mu m$ and as great as 5, 6, 7, 8, 9, or 10 $\mu m$, for example, or may have a thickness within any range defined between any pair of the foregoing values.

Similar to manner in which barrier layer 18 is formed on lead frame 14, layer 20 may be deposited on barrier layer 18 via an electrolytic or electro-less plating process, for example, and also may be deposited in a continuous or blanket manner over the entire lead frame and/or barrier layer or alternatively, may be deposited over only the die pad areas and/or other selected regions of the surface of lead frame and/or barrier layer.

Referring to FIGS. 1A and 1B, lead-free, zinc-based solders may advantageously be used in the present packaging arrangements for the solder layer 22 used to connect chip 12 to lead frame 14. As used herein, the terms "lead-free" or "lead-free solder" refer to solder materials including less than 0.1 wt. % lead. Also, as used herein, the terms "zinc-based" or "zinc-based solder" refer to a solder composition including zinc in combination with, or alloyed with, one or more other elements in which zinc is present as the majority or principal component. Suitable zinc-based solders are disclosed in the above-incorporated U.S. patent application Ser. No. 13/586,074.

The present inventors have found that a disadvantage of applying a zinc-based solder directly to a copper lead frame is that, although the zinc-based solder uniformly wets the surface of the copper lead frame during a die connect process, the elevated liquidus temperature of the liquid, flowable zinc-based solder, which is typically greater than 330° C. for zinc-based solders, results in the formation of copper/zinc (Cu/Zn) intermetallic compounds that are relatively brittle and typically manifest in the formation of a Cu/Zn intermetallic layer or interface between the copper lead frame and the zinc-based solder upon solidification of the zinc-based solder. The intermetallic layer may be relatively thick when liquid zinc-based solder is applied directly to a copper lead frame.

Additionally, after manufacture and during use of the packaging arrangement in a service application in which the electronics packaging arrangement is exposed to high temperatures, such as greater than about 150° C., for example, further Cu/Zn intermetallic compounds may be formed and, in this manner, the thickness of the Cu/Zn intermetallic layer or interface may increase over time. In many electronics packaging configurations, particularly in "large frame" applications having a chip-to-lead frame connection of greater than 25 mm$^2$, for example, the thickness of the Cu/Zn intermetallic layer may have an undesirable thickness, or may eventually increase during use to an undesirable thickness, potentially resulting in a die crack event in which the connection between the chip and the lead frame fails across the relatively brittle intermetallic layer. In addition, the relatively high modulus of zinc-based solders tends to provide little stress relief to the foregoing connections.

Additionally, zinc-based solders tend to wet rather poorly onto metallic barrier layers such as nickel, which are provided to protect the underlying lead frame from oxidation, as discussed above.

However, the layer 20 provided in the present packaging arrangement disclosed herein is relatively thin and, for the reasons discussed below, may be considered as a wetting-inducing, sacrificial layer. When made of copper or a copper alloy, for example, layer 20 initially provides an exposed copper layer or surface to promote uniform wetting of a zinc-based solder upon flow application during the die connect process, and yet substantially completely reacts with zinc in the zinc-based solder to form a thin, dedicated Cu/Zn intermetallic layer 24 or interface between the barrier layer 18 and the solder layer 22, as shown in FIGS. 1A and 1B. The dedicated Cu/Zn intermetallic layer 24 results from consumption of substantially all of the copper initially present in the copper layer 20, and thereby results in a Cu/Zn intermetallic layer which is relatively thin, and has no possibility of increasing during use of the electronics packaging arrangement due to the fact that substantially all of the copper in the copper layer 20 combines with zinc in the solder to form the intermetallic layer 24 during solder flow in the die connect process. Also, the dedicated Cu/Zn intermetallic layer 24 is sufficiently thin that the likelihood of crack failure within such layer is substantially decreased, leading to favorable endurance characteristics for the packaging construct.

The dedicated, Cu/Zn intermetallic layer 24 may have a thickness up to 10 microns (μm), such as between 3 μm and 10 μm. In one embodiment, the thickness of copper layer 16 may be as little as 3, 4, or 5 μm and as great as 5, 6, 7, 8, 9, or 10 μm, for example, or may have a thickness within any range defined between any pair of the foregoing values.

Although solder layer 22 has been described as a lead-free, zinc-based solder, in alternative embodiments, solder layer 22 may be a lead-free, tin-based solder. As used herein, the terms "tin-based" or "tin-based solder" refer to a solder composition including tin in combination with, or alloyed with, one or more other elements in which tin is present as the majority or principal component. In such embodiments, the intermetallic layer 24 will be a Cu/Sn intermetallic layer.

In further alternative embodiments, solder layer 22 may be a lead-based solder. As used herein, the terms "lead-based" or "lead-based solder" refer to a solder composition including lead in combination with, or alloyed with, one or more other elements in which lead is present as the majority or principal component. In such embodiments, the intermetallic layer 24 will be a Cu/Pb intermetallic layer.

EXAMPLES

The following non-limiting Examples illustrate various features and characteristics of the present invention, which is not to be construed as limited thereto.

Example 1

Preparation of Lead Frame Constructs

In this Example, lead frame constructs according to the present disclosure were prepared. Pure copper lead frames were obtained, and were plated with pure nickel to a thickness of 6 μm using an electro-less plating process.

Relatively thin layers of copper were deposited onto the nickel layers via an electroplating process.

Figure 3:
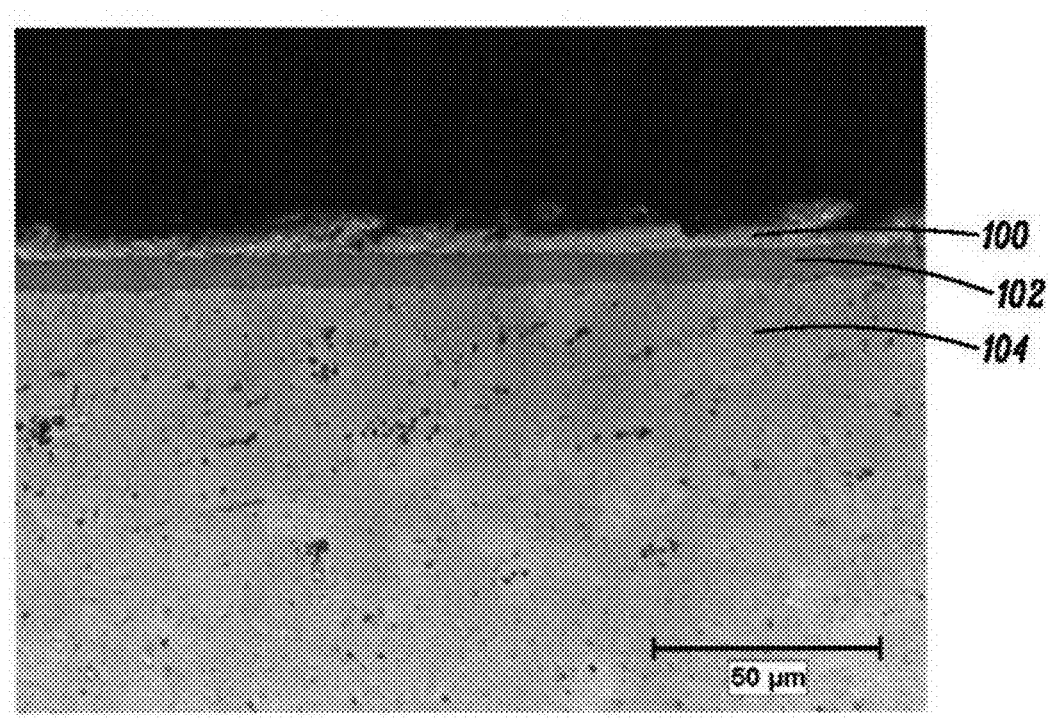
Figure 4:
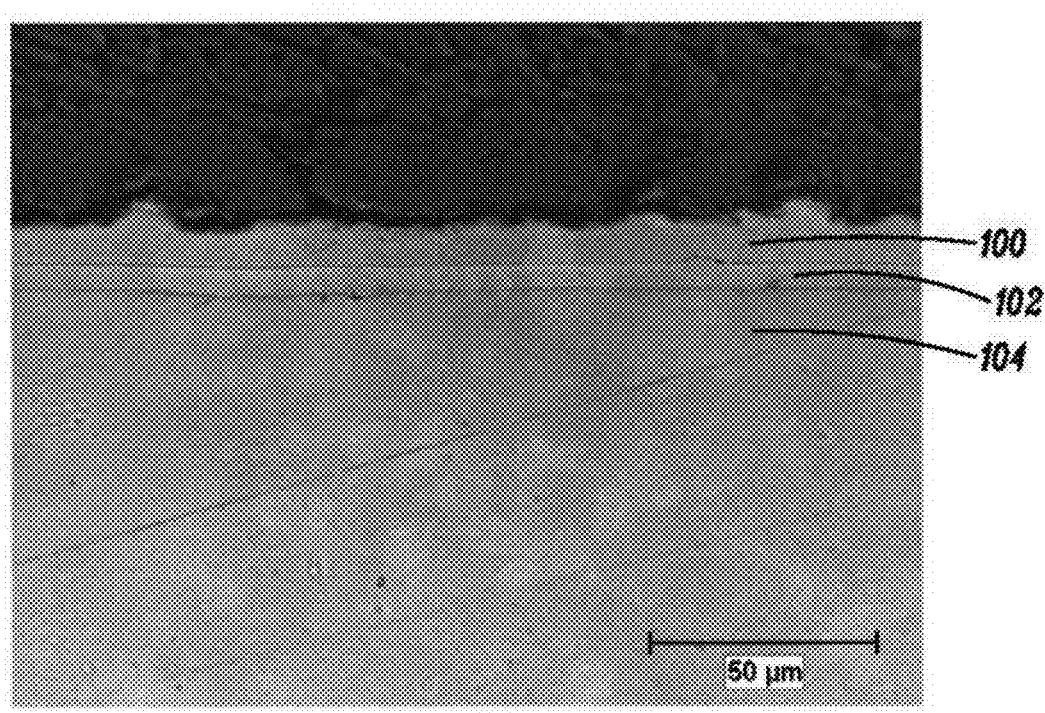

FIG. 3 is an SEM cross sectional image of a first lead frame construct having a copper layer of 2 μm thickness, and FIG. 4 is an SEM cross sectional image of a second lead frame construct having a copper layer of 8 μm thickness. The lead frame constructs include copper lead frames 104, nickel plating 102 and copper flash 100.

Example 2

Solder Wetting Study

Figure 5:
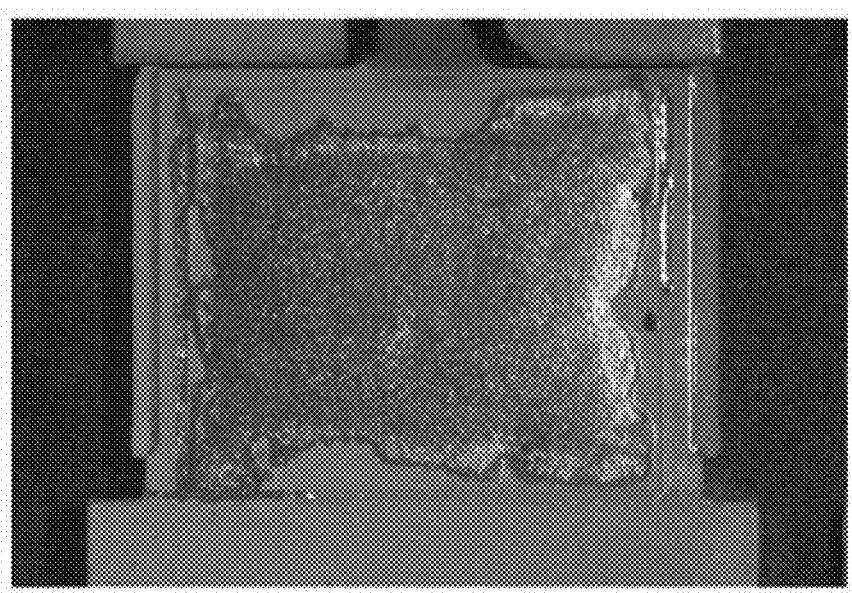
Figure 6:
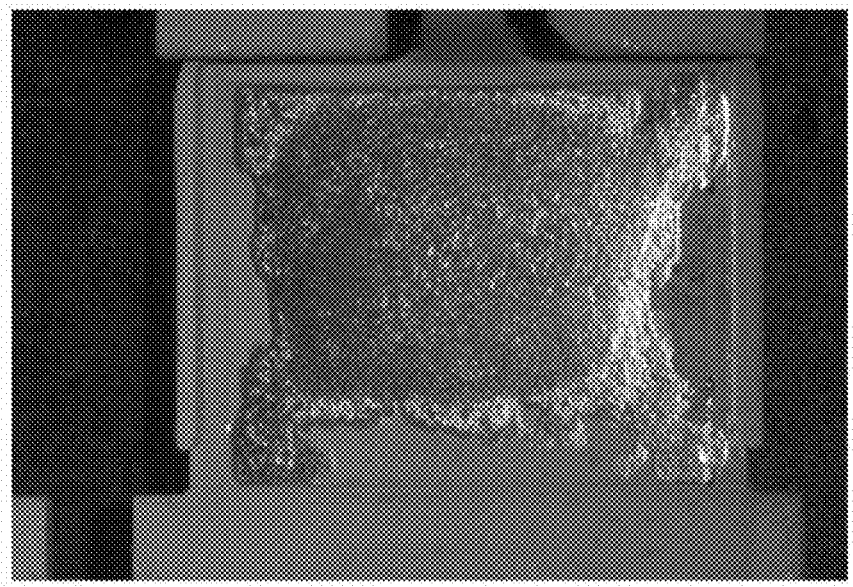

A zinc-based solder was heated above its liquidus temperature and was wetted onto the lead frames of FIGS. 3 and 4 using an ASM 890 die bonder, with the results shown in the images of FIGS. 5 and 6, respectively. As shown in FIGS. 5 and 6, the zinc-based solder wetted uniformly across the copper layers of the lead frames with broad coverage on both of the lead frames having the 2 μm (FIG. 5) and 8 μm (FIG. 6) copper layers.

Figure 7:
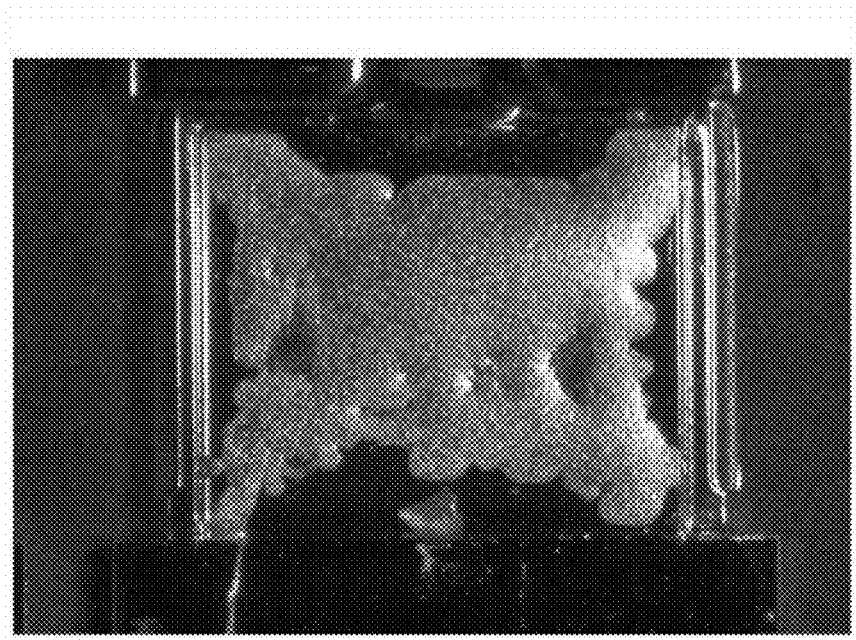

In a comparative example, the same zinc-based solder was wetted onto a control lead frame which included a nickel barrier layer but not an overlying copper layer. As may be seen in FIG. 7, the solder wetting was not uniform, but rather significant areas of de-wetted solder were observed, together with a solder ball representing a volume of solder that became separated from the main solder field during solder flow.

Example 3

Analysis of Cu/Zn Intermetallic Layer

Figure 8:
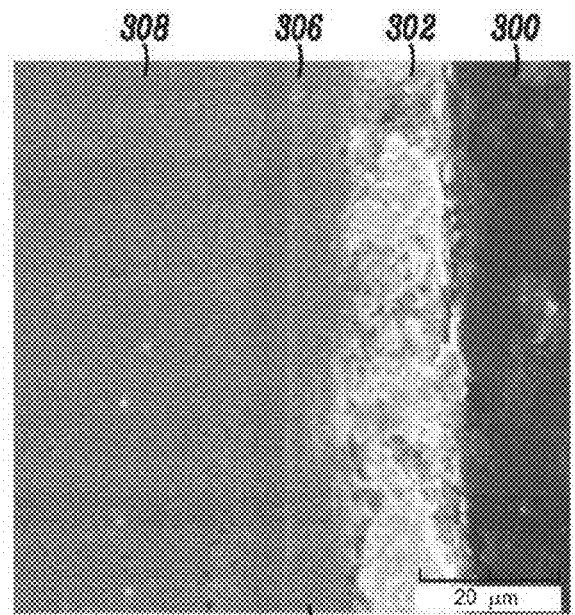
Figure 9A:
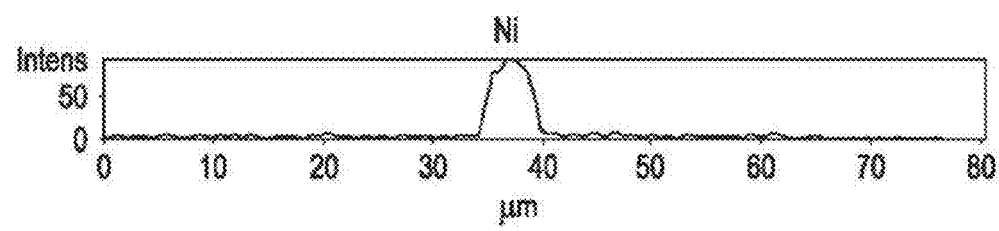
FIGS. 9A, 9B and 9C are a series of plots corresponding to an X-ray line scan elemental analysis of FIG. 8 for nickel, copper and zinc respectively.
Figure 9B:
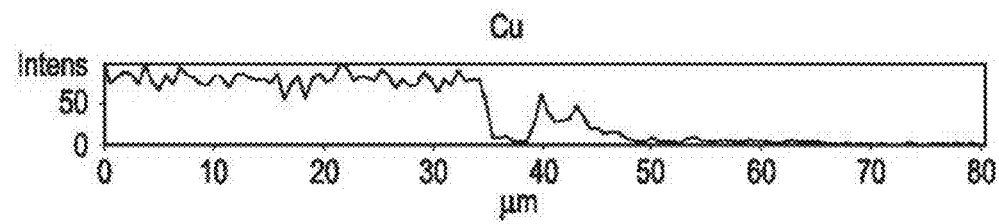
Figure 9C:
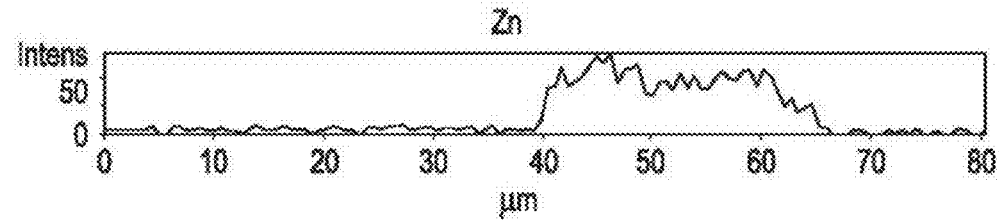
Figure 10:
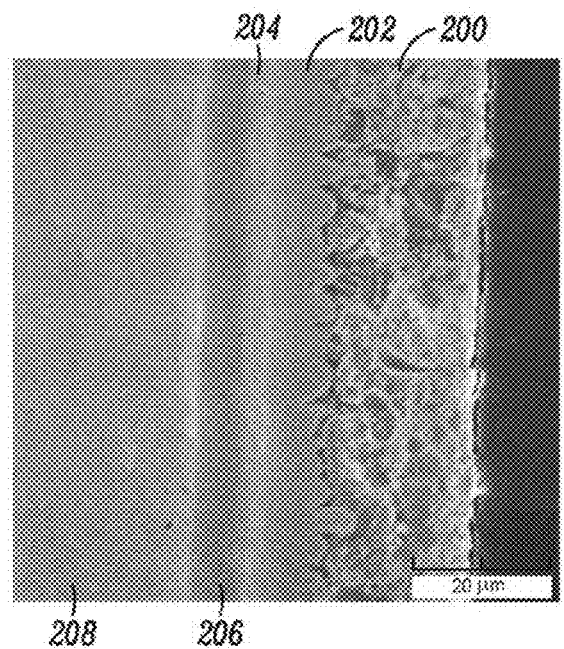

FIGS. 8 and 10 are SEM cross sectional images taken of the lead frames of FIGS. 5 and 6, respectively, after flow and solidification of the zinc-based solder onto the lead frames. FIGS. 9A, 9B and 9C, and 11A, 11B and 11C are X-ray line scan elemental analyses taken at various depths throughout the cross sections of the material lead frames.

Referring to FIGS. 8 and 9A, 9B and 9C, for the lead frame having a 2 μm copper layer, substantially all of the copper in the layer reacted with zinc from the zinc-based solder to form a Cu/Zn intermetallic layer having a thickness of about 2 μm, with substantially no copper of the layer remaining as unreacted, pure copper. Referring to FIG. 8, the lead frame construct includes copper lead frame 308, nickel 306, copper-zinc intermetallic layer 304 and zinc based solder 302. Referring to FIGS. 9A, 9B and 9C, it may be seen that a distinct layer of pure nickel, as well as a Cu/Zn intermetallic layer, were formed.

Figure 11A:
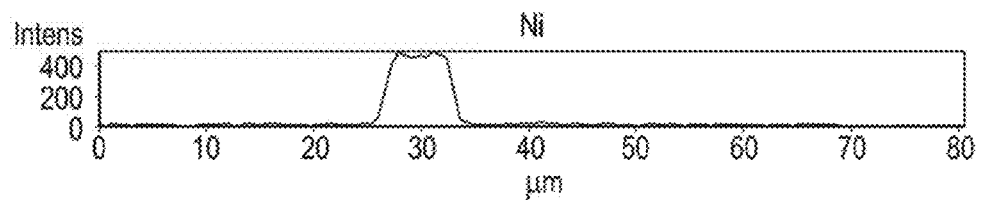
FIGS. 11A, 11B and 11C are a series of plots corresponding to an X-ray line scan elemental analysis of FIG. 10 for nickel, copper and zinc respectively.
Figure 11B:
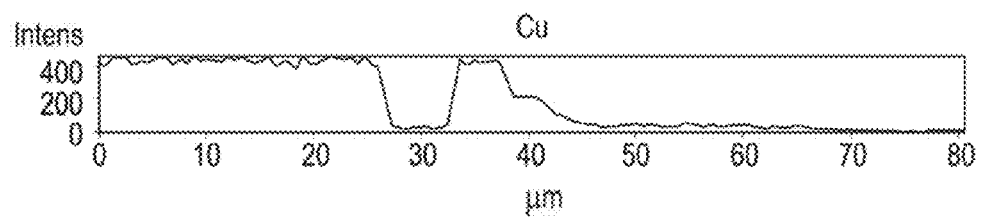
Figure 11C:
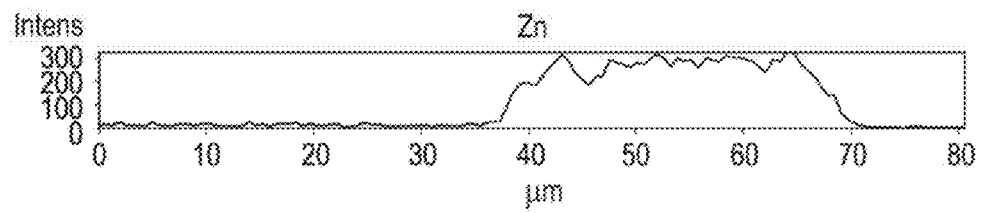

Referring to FIGS. 10 and 11A, 11B and 11C, for the lead frame having a 8 μm copper layer, copper up to a depth of about 4 μm in the copper layer reacted with zinc from the zinc-based solder to form a Cu/Zn intermetallic layer having a thickness of about 4 μm, with about 4 μm of pure copper of the original copper layer remaining pure and unreacted. Referring to FIG. 10, the lead frame construct includes copper lead frame 208, nickel 206, copper layer 204, copper-zinc intermetallic layer 202 and zinc based solder 200. Referring to FIGS. 11A, 11B and 11C, it may be seen that distinct layers of pure nickel and pure copper, as well as a Cu/Zn intermetallic layer, were formed.

While this disclosure has been described as having exemplary designs, the present disclosure can be further modified within the spirit and scope of this disclosure. This application is therefore intended to cover any variations, uses, or adaptations of the disclosure using its general principles. Further, this application is intended to cover such departures from the present disclosure as come within known or customary practice in the art to which this disclosure pertains and which fall within the limits of the appended claims.

What is claimed is:

1. An electronics packaging arrangement, comprising:
   a lead frame having a surface;
   a metallic barrier layer disposed on said surface of said lead frame;
   a chip connected to said metallic barrier layer via a zinc-based solder layer; and
   an intermetallic layer disposed between said metallic barrier layer and said zinc-based solder layer, said intermetallic layer comprising an intermetallic compound including zinc.

2. The arrangement of claim 1, wherein said intermetallic compound is a zinc-copper intermetallic compound.

3. The arrangement of claim 1, wherein said intermetallic layer has a thickness between 3 μm and 10 μm.

4. The arrangement of claim 1, wherein said metallic barrier layer comprises one of nickel and a nickel alloy, and has a thickness between 1 μm and 10 μm.

5. The arrangement of claim 1, wherein an area of said chip-to-lead frame connection is greater than 25 mm².

6. The arrangement of claim 1, wherein the intermetallic layer comprises at least one member selected from the group consisting of copper and a copper alloy.

7. The arrangement of claim 1, wherein the intermetallic layer comprises at least one member selected from the group consisting of zinc, bismuth, tin, indium, gold, silver, palladium, platinum and alloys thereof.

8. A method of manufacturing an electronics packaging arrangement, said method comprising the steps of:
   providing a lead frame including a metallic barrier layer disposed on a surface of the lead frame, and a wetting promoting layer disposed on the metallic barrier layer;
   connecting a chip to the lead frame by the following steps:
      flowing a zinc-based solder over the wetting promoting layer;
      placing a chip on the zinc-based solder; and
      solidifying the zinc-based solder with formation of an intermetallic layer between the zinc-based solder and the metallic barrier layer, the intermetallic layer comprising an intermetallic compound including zinc.

9. The method of claim 8, wherein the wetting promoting layer is selected from copper and a copper alloy, and the intermetallic compound is a zinc-copper intermetallic compound.

10. The method of claim 8, wherein the wetting promoting layer is selected from zinc, bismuth, tin, indium, gold, silver, palladium, platinum and alloys thereof, and the intermetallic compound is a zinc-copper intermetallic compound.

11. The method of claim 8, wherein the intermetallic layer comprises copper or copper alloy.

12. The method of claim 8, wherein said solidifying step further comprises forming the intermetallic layer to a thickness between 3 μm and 10 μm.

13. The method of claim 8, wherein said metallic barrier layer comprises one of nickel and a nickel alloy, and has a thickness between 1 μm and 10 μm.

14. The method of claim 8, wherein an area of the chip-to-lead frame connection is greater than 25 mm².

* * * * *